(12) United States Patent
Merk et al.

(10) Patent No.: US 7,039,624 B1
(45) Date of Patent: May 2, 2006

(54) METHOD OF REPRESENTING DATA PACKAGES IN COMPACT FORM AND OF STORING OR TRANSMITTING THE DATA PACKAGES

(75) Inventors: Lothar Merk, Weil (DE); Thomas Schaeck, Achern (DE); Thomas Stober, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 979 days.

(21) Appl. No.: 09/616,232

(22) Filed: Jul. 14, 2000

(30) Foreign Application Priority Data

Jul. 17, 1999 (DE) ................................ 199 33 584

(51) Int. Cl.
*G06F 17/30* (2006.01)
(52) U.S. Cl. ............................. 707/1; 707/10; 709/207
(58) Field of Classification Search .................... 707/1, 707/3, 7, 10, 104.1; 709/207
See application file for complete search history.

(56) References Cited

U.S. PATENT DOCUMENTS

| | | | | |
|---|---|---|---|---|
| 6,101,477 A * | 8/2000 | Hohle et al. | ................... | 705/1 |
| 6,111,660 A * | 8/2000 | Murray | ........................ | 707/101 |
| 6,298,353 B1 * | 10/2001 | Apte | ............................ | 707/10 |
| 6,301,585 B1 * | 10/2001 | Milne | ......................... | 707/101 |
| 6,343,287 B1 * | 1/2002 | Kumar et al. | ................ | 707/100 |
| 6,356,946 B1 * | 3/2002 | Clegg et al. | ................... | 707/10 |
| 6,362,836 B1 * | 3/2002 | Shaw et al. | .................. | 709/207 |
| 6,438,559 B1 * | 8/2002 | White et al. | ................... | 707/10 |

* cited by examiner

*Primary Examiner*—Charles Rones
*Assistant Examiner*—Hassan Mahmoudi
(74) *Attorney, Agent, or Firm*—Louis P. Herzberg; Anne V. Dougherty

(57) ABSTRACT

A method whereby packages of data, and particularly Java objects, are represented in serialized form on a storage medium before they are transmitted or stored. The packages of data are examined for non-application-dependent identifications and are altered whereby the non-application-dependent identifications are replaced by substitutes which require little storage space. In a further embodiment, the application-dependent identifications too are represented by special substitutes. The data package is represented so that it can be stored on storage media and can be restored unchanged at any desired time on any desired system. The restoration is performed by applying the algorithm in a similar way but in reverse, once again in a black box.

38 Claims, 1 Drawing Sheet

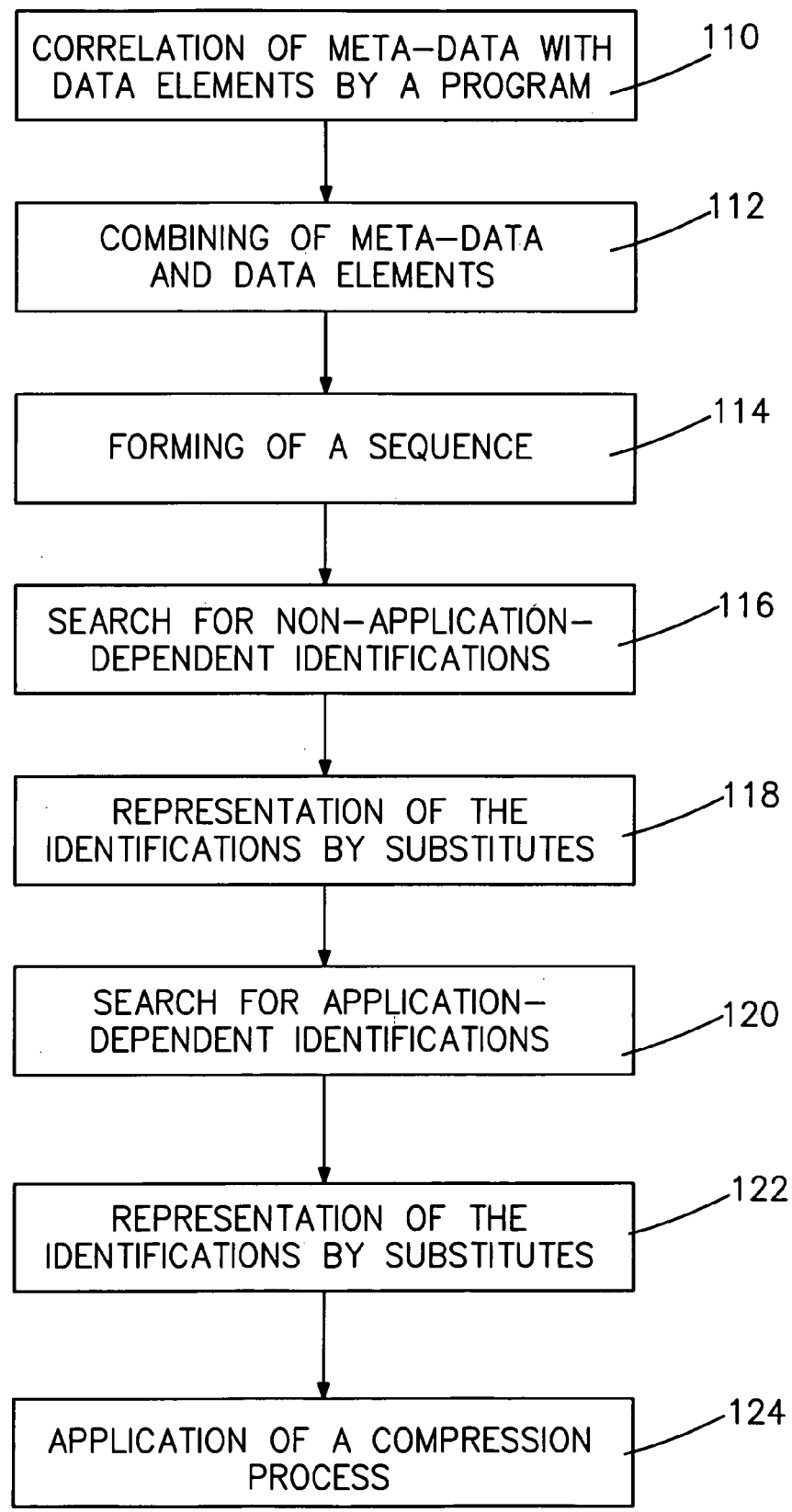

METHOD OF REPRESENTING DATA PACKAGES IN COMPACT FORM AND OF STORING OR TRANSMITTING THE DATA PACKAGES

FIELD THE INVENTION

The present invention relates to a method for the representation in compact form of packages of data, and particularly Java objects, for storing them on a storage medium, and particularly a chip card (smart card), having limited storage space, or for transmitting them on a channel of limited band-width.

BACKGROUND OF THE INVENTION

The storage of objects is a primary concern in the development of object-orientated software. An object is a software unit which is closed off from the exterior and whose attributes are fixed internally by a series of local variables. The content of these local variables defines the state of the object but outside the object neither the local variables nor their content can be seen. The state of an object can only be changed by running one of its local subroutines. These subroutines are also known as methods. An object is requested to run a method by another object as a result of the object making the request sending a message to this effect. The object addressed will, assuming it understands the message, cause the appropriate method (local subroutine) to be run. Storing objects consists of storing both the attributes and the state in which methods/algorithms are, so that the latter can be continued seamlessly when the object is restored. Persistance, CORBA and ORB are jargon terms currently used to describe this.

For chip cards, there is no way of achieving this. Data is usually stored on them in conventional file structures. For the application data relating to the host application, there are various simple file types and file directories available on the card. Data is exchanged between host and card by means of individual command sequences (APDU's) to which the data is attached in the form of bytes. It is file-orientated cards of this kind which are most widely used today.

A widely used Java method of storing object states is known as object serializing. What object serializing means is that any desired object is converted into a sequence of bytes which represent the object and its present state. For this purpose all the attributes and their names and all the other objects to which the object makes reference are stored. Given this information, the object can be restored unchanged. The restoration is performed in a similar way: the object, and all the other objects to which it makes reference, is instanced and, using the data read from the chip card, initialized. The byte array which represents the object can be stored without any problems both on JavaCards and on conventional file-orientated cards.

The methods known hitherto for serializing and storing objects were designed for powerful computers. However, because they require too much storage space they are not suitable for storing objects on chip cards or storage media on which there is little storage space or else the only objects which can be stored in serialized form on chip cards are very small ones. For example, in Java object serialization several hundred bytes are required even for small objects with only a few attributes.

The object of the invention is therefore to provide a method whereby data packages can be easy and quickly stored in a very compact form on a storage medium having only limited storage space or can be transmitted over a transmission channel of narrow band-width, in such a way that the data package can be restored at the receiving end.

SUMMARY OF THE INVENTION

The foregoing and other objects are realized by the present invention comprising a method whereby packages of data, and particularly Java objects, are represented in serialized form on a storage medium before they are transmitted or stored. The packages of data are examined for non-application-dependent identifications and are altered whereby the non-application-dependent identifications are replaced by substitutes which require little storage space. In a further embodiment, the application-dependent identifications too are represented by special substitutes. As a result of this method it is possible to represent complex data packages in a compact form without the packages having to be broken down into individual components and individually optimized. The data package is represented as a whole in a manner optimized with respect to storage space so that it can be stored on storage media, such as chip cards for example, and can be restored unchanged at any desired time on any desired system. The restoration is performed by applying the algorithm in a similar way but in reverse, once again in a black box. The data package does not need to be analyzed in a way specific to the application and context or to be broken down into individual items of data. The application of this method produces an approximate 30% greater compression of the representation of the data in a data package.

The method according to the invention allows complex data packages (such as objects as understood in object-orientated programming) to be represented in a compact form, without the packages having to be broken down into individual components (such as attributes) and individually optimized. The data package is represented as a whole (in a "black box") in a manner optimized with respect to storage space so that it can be stored on storage media such as chip cards and can be restored unchanged at any desired time on any desired system. The restoration takes place by applying the algorithm in a similar way but in reverse, once again in a black box.

There is no need for the data package to be analyzed in a way specific to the application and context or for it to be broken down into individual items of data. The algorithm is applied to the data package as a whole and is non-application-dependent (if stage 3 below is employed, all that this stage requires is the dictionary that needs to be used). In itself the compact representation contains all the data needed to allow the data package to be restored unchanged at some other point.

As far as the restoration of the data package is concerned, no other information apart from the compact data package itself is needed to restore it (apart from the dictionary if stage 3 below is employed where appropriate).

BRIEF DESCRIPTION OF THE DRAWING

The present invention will now be described in detail by reference to a preferred embodiment and in relation to the appended FIGURE which shows a representative process flow for implementing the present invention.

DETAILED DESCRIPTION OF THE INVENTION

Data packages for the purposes of the present invention are, for example:

1) objects as understood in object-orientated programming (e.g. in the object-orientated programming languages Java, C++)
   e.g. in a Java program
   public Object Ticket {
   public String departure="Stuttgart";
   public string destination="Frankfurt";
   public Ticket( ); /*Constructor*/
   };
2) Data structures (e.g. in the classic programming language C)
   e.g. in a C program
   Structure Ticket {
   String departure="Stuttgart";
   String destination="Frankfurt";
   }
3) Semantic definitions of data (e.g. HTML, XML, scripts) e.g., in an imaginary (!) script language:
   <TICKET><STRING><DEPARTURE>"Stuttgart"
   <STRING>
   <DESTINATION>"Frankfurt"

The data packages consist of meta-data and data elements. Meta-data is data which is required to define the data elements (e.g. the name and type of a data element). Data elements are the actual useful data.

Storage media for the purposes of the present invention are, for example:

hard disks, chip cards (smart cards), diskettes and the like. Media which are used for the temporary storage of the data package in question in its current state so that the same package can be recovered in this unchanged state at some other time and in some other system.

The method according to the present invention for representing data packages in compact form will be described with reference to the inventive method steps in relation to the attached FIGURE. Some method steps constitute special embodiments of the method according to the invention to allow the compression factor to be increased.

For the purposes of the invention described below, serializing means 1) that the meta-data and data elements are combined to form a unit of data (data package) or 2) that only the data elements are represented, in a sequence, with the recipient performing the correlation between meta-data and data elements. In what follows it will be assumed that the serializing process is as in 1).

1. At steps 110 meta-data is correlated to, and at 112 combined with data elements to form a data package in a representation (i.e., "sequence" at 114) which contains all the details required for restoring the data. The meta-data may for example be the object name, object version, object type, attributes, attribute types and current attribute values. What have to be stored for the Java object "Ticket" are Object: This is an object of the type "java.lang.Object" with the name "Ticket" (with a version stated where appropriate).

The attributes the object has are as follows:
Attribute1: an attribute "departure" of the type "java.lang.String" with a current value of "Stuttgart"
Attribute2: an attribute "destination" of the type "java.lang.String" with a current value of "Frankfurt"

2. In the representation of the data packages, the identifications used in them (name and type identifications), such as java.lang.String, java.lang.Object, etc. are located at 116 and shown as special predefined identifiers or substitutes at 118 (e.g. tags from a TLV coding conforming to ISO 8825 BER-TLV). This produces a representation which, when processed to be read by humans, can be depicted thus:

---

[(1, 1, true) 321]
(
[(15, 1, false) 21] ( "tests.compress.Ticket" )
[(7, 2, true) 294]
(
    [(18, 1, false) 13] ( "departure" )
[(8, 2, false) 1] ( '01' )
[(16, 1, false) 9] ( "Stuttgart" )
[(18, 1, false) 15] ( "destination" )
[(8, 2, false) 1] ( "01" )
[(16, 1, false) 10] ( "Frankfurt" )

---

The meanings of the components in this case are as follows:
[(tag identifier,class,constructed flag) length] (content)

The purpose of the tag identifier is to distinguish between different tags, that of class is to distinguish between different classes of tag, and the constructed flag indicates whether the tag is followed simply by useful data or again whether it is followed by further tags with associated useful data. Length gives the number of bytes of useful data which follow and content means either associated useful data or further tags.

3. In a particular embodiment of the present invention, use is made of the following additional method step: the foregoing steps are repeated but it is not non-application-dependent identifications which are represented by identifiers (substitutes) but application-dependent ones. Searching is done at 120, followed by representing the application-dependent identifications by substitutes at 122. Preferably a dictionary is needed, this dictionary specifying specific identifiers for a specific application context (e.g. in travel applications tag xy could stand for "departure" and tag yz for "destination"). In this way a further reduction can be achieved in the storage space needed for representing the data package. This produces a representation which may for example look like this:

---

[(1, 1, true) 321]
(
    [(15, 1, false) 21] ( "test".compress.Ticket" )
    [7, 2, true) 294]
    (
        [(26, 1, false) 9] ( "Stuttgart" )
        [(26, 1, false) 10] ( "Frankfurt" )
    )
)

---

4. In a further special embodiment, use is made of the following additional method step: the representation obtained is again compressed, with the help of current compression algorithms at step 124, e.g. ZLIB.

What is obtained overall by the process flow is a compact representation of data packages which takes up approximately 30% less storage space than a serialization of the usual kind by compression algorithms such as ZLIB set for best possible compression.

Despite the compression of the data package it contains all the information needed to allow it to be restored unchanged at some other time and some other place.

The method according to the present invention will now be described by reference to Java objects.

Illustrative Application:

In the following illustrative embodiment, Java object serialization is replaced by a serializing process using TLV (tag length value) structures. If objects are stored on a chip card by means of TLV structures, this saves storage space due to the fact that the tags are preprocessed.

The saving of storage space takes place in four steps:
1. Generation of the object representation (combining of meta-data and data elements, forming of a sequence).
2. Encoding of the non-application-dependent identifications into tags, e.g. for objects, attributes, names, classes, etc.
3. Encoding of the application-dependent identifications into tags.
4. Additional compression.

Procedure:

An object is represented on the chip card as follows:
name of object
type of object (string, integer, object)
version
attributes of object (attributes and the values of the attributes may themselves be objects).

EXAMPLE

In the following example all the words shown in capitals can be represented by tags. Associated with each tag there is a value and the length of this value.

```
NAME("BC")
TYPE(OBJECT)
OBJECT (
    NAME("com.ibm, businesscard.BusinessCard")
    TYPE(object)
    VERSION("1.1")
    ATTRIBUTES(
        NAME("Name")
        TYPE(STRING)
        VALUE("Smith")
    )
    ATTRIBUTE(
        NAME("Address")
        TYPE(OBJECT)
        OBJECT(
            NAME("com.ibm.business.Address")
            VERSION("1.0")
            ATTRIBUTE(NAME("Street") TYPE(STRING)
            VALUE("132 Anywhere Street"))
            ATTRIBUTE (NAME ("City") TYPE(STRING)
            VALUE("Anytown"))
        )
    )
)
```

The correlation between an "identifier" (substitute) and a tag is stored in a table which is part of the compression algorithm according to the invention. The tags are preferably determined in accordance with BER-TLV. The identifiers which are defined as tags are preferably the ones which are application-dependent. An example of a correlation is shown in the table below.

| Tags | Class | ID | Constructed | Encoding (hex) |
|---|---|---|---|---|
| OBJECT | 2 | 0 | true | A0 |
| CLASS | 2 | 1 | false | 81 |
| VERSION | 2 | 2 | false | 82 |
| ATTRIBUTE | 2 | 3 | true | A3 |
| NAME | 2 | 4 | false | 84 |
| TYPE | 2 | 5 | false | 85 |
| VALUE | 2 | 6 | false | 86 |
| Type | ID | | | |
| INTEGER | 0 | | | |
| STRING | 1 | | | |
| OBJECT | 2 | | | |
| . . . | | | | |

In the example:

A0 (tag hex for object)
xx
    84 (tag hex for name) 32(length in bytes)
    "com.ibm.businesscard.BusinessCard"
    82 (tag hex for version) 03(length in bytes)
    "1.0"
    A3 (tag hex for attribute) 35(length of attribute in bytes) Value: 84, 85, 86
    84(tag hex for name)04 (length of name) "Name" (Value)
    85(tag hex for type)01 (length of type) Value:1
    86(tag hex for value) 10(length of value)Value:"Smith"
    A3(tag hex for attribute)35(length of attribute in bytes)value: 84, 85, 86
    84(tag hex for name)04(length of name) value "address"
    85(tag hex for type) 01 (length of type)
    Value:2

.
.
.

To increase the compression even further, the following second phase of compression can be used: the result achieved by the method described above is then searched for defined, application-dependent name and type identifications for objects. For this method step there are special tags available which can be used to represent such identifications in a space-saving manner. This produces further compression.

The correlation between these application-dependent identifications and the tags by which the identifications can be represented must of course be known to everybody involved who wishes to read or write data. It is conceivable for different correlation tables to be defined for different application contexts. Structures and types which are quite often needed in a given context could be defined to prevent the storage of redundant information. Where the application context was "Travel" for example, tags such as seat, destination, departure time, etc. could be defined.

The makeup, definition and length of tags are laid down in standards ISO/IEC 7816 and 8825. For the present new application of TLV structures it may be necessary for the maximum length of the tags to be increased. The following example will elucidate the second stage of compression: the name "com.ibm.businesscard.BusinessCard" is defined in the application context and it can be represented in abbreviated form as follows:

A0 (tag hex for object)
xx
    84 (tag hex for name) 32(length in bytes) BF
    82 (tag hex for version) 03(length in bytes)"1.0"

-continued
```
    A3 (tag hex for attribute) 35(length of attribute in
    bytes)Value:84, 85, 86
      84(tag hex for name)04( length of name) "Name" (Value)
      85(tag hex for type) 01(length of type) value:1
      86(tag hex for value) 10(length of value)Value:"Smith"
      A3(tag hex for attribute)35(length of attribute in
      bytes)value:84, 85, 86
        84(tag hex for name)04(length of name) value "address"
        85(tag hex for type) 01 (length of type) Value:2
.
.
Tag        Class  ID    Constructed      Type  Class
BF         2      100   true             Name
Com.ibm . . . BusinessCard
```

The correlation between tag and identifier must be known to the recipient or must be transmitted at the same time (e.g. a tupel of the form <tag,class,ID,constructed,type,class>)

Evaluation of Method

To assess the potential of the inventive method which has been described, various objects were compressed by this method and values found for the compression thereby achieved. What were taken as a standard of comparison in this case were in particular the results which were achieved with other, known compression algorithms.

Example 1

```
The following object describes an airline ticket:
public class Ticket extends Object implements Serializable
{
public String passengerName = "John Smith";
public String passengerAddress = "132 Anywhere Street";
public String passengerCity = "Anytown AN6 0XY";
public String departureCity = "Stuttgart";
public String destinationCity = "Whitehorse";
public Integer flightNumber = new Integer(478);
public String airline = "BA";
public String date = "24.12.99";
public String departureTime = "11:00";
public String ticketPrice = new Integer(1200);
public Integer status = new Integer(1);
    // Default Constructor
    public Ticket ( ) {
    }
}
```

Example 2

```
In this case the airline ticket contains the passenger
information in a separate object. Hence the method must be used on
nested objects and this calls for recursion.
    public class Ticket2 extends Object implements Serializable
{
    public Passenger passenger
      = new Passemger ("John Smith";
      "132 Anywhere Street";
      "Anytown AN6 0XY");
public String departureCity = "Stuttgart";
public String destinationCity = "Whitehorse";
public Integer flightNumber = new Integer(478);
public String airline = "BA";
public String date = "24.12.99";
public String departureTime = "11:00";
```

-continued
```
public Integer ticketPrice = new Integer(1200);
public Integer status = new Integer(1);
    // Default Constructor
    public Ticket2 ( ) {
    }
}
public class Passenger extends Object implements Serializable
{
public String passengerName = "John Smith";
public String passengerAddress = "132 Anywhere Street";
public String passengerCity = "Anytown AN6 0XY";
    // Default Constructor
    public Passenger ( ) {
    }
}
```

Values Found for Compression Achieved:

The table below shows the storage space required for representing the objects taken as examples with conventional serialization and when using the first stage of the compact form of representation described above. An additional improvement in the result was obtained in each case by employing the "ZLib Data Compression Algorithm" set for "Best Compression".

Application of the second stage of the method described above would produce a further improvement but this was not covered in the present evaluation.

|  | Conventional object serialization in Java | Conventional object serialization in Java with additional compression (Zlib Data Compr. Algorithm) | Compact representation of objects (1$^{st}$ stage) | Compact representation of objects (1$^{st}$ stage) with additional compression (Zlib Data Compr. Algorithm) |
|---|---|---|---|---|
| Example 1 | 642 bytes | 353 bytes | 325 bytes | 245 |
| Example 2 | 725 bytes | 392 bytes | 374 bytes | 268 |

In the case of example 1, 31% greater compression was achieved than with a serialized object compressed with Zlib. In the case of example 2 the compression was 32% better. Various other objects which were looked at gave figures of between 16% and 40%.

The main aim of the method is to minimise the meta-data in an object representation. What this means is that the shorter the data length of the individual attributes in an object, the more the compression factor rises. Where the data content per attribute is very high, the benefit is slightly less.

Advantages of the Solution

By replacing Java object serialization with the method described, objects can be stored on chip cards compactly and with a saving in space. On the one hand this simplifies the programming work needed for storing object data on a chip card and reading it, and on the other, the use of this method produces object representations which are very small. There has been found to be a reduction in storage space of 25–50% compared with conventional object serialization.

The second stage of the method described produces additional compression. However, it requires a standardised definition of application attributes specific to a given sector or industry.

For their context, applications for the tourist industry for example could replace a range of attributes such as airfare, departure date, passenger name, etc. by standardised tags.

Another advantage of this solution is the bridge it builds between object serialization methodology and the use of the TLV process.

In what follows an actual implementation of the present invention will be shown.

```
/****************************************************************
 * serialize
 * Serializing the state of a given object, using common Java
   methods
 ****************************************************************/
public byte[] serialize(Object object)
{
        byte[] result = null;
        try {
        // create a byte array and an output stream
        ByteArrayOutputStream buffer = new
        ByteArrayOutputStream( ) ;
        //    FileOutputStream      buffer     =     new
        FileOutputStream("test") ;
         ObjectOutputStream out = new ObjectOutputStream(buffer) ;
        // write to stream
        out.writeObject(object) ;
        out.close( ) ;
        // result
        result = buffer/toByteArray( ) ;
} catch (Exception e) {
        System.out.println("It happens") ;
}
return result;
}
/****************************************************************
 * restore
 * Restoring a serialized Jav Object, using common Java methods
 ****************************************************************/
public Object restore(byte[] data) {
        Object object = null;
        try {
        // create a byte array input stream
        ByteArrayInputStream buffer = new
        ByteArrayInputStream(data) ;
         ObjectInputStream in = new ObjectInputStream(buffer) ;
        // read from stream
        object = in.readObject( ) ;
        in.close( ) ;
} catch (Exception ex) {
        System.out.println("It happens") ;
}
return object;
}
/****************************************************************
 * simpleZip
 * Compressing bytes using the common ZLIB algorithm with
   BEST_COMPRESSION option
 ****************************************************************/
public byte[] simpleZip(byte[] data) {
        byte[] result = null;
Deflater deflater = new Deflater(Deflater.BEST_COMPRESSION,
true) ;
deflater.setInput (data, 0, data.length) ;
deflater.finish( ) ;
        byte[] buffer = new byte[5000] ;
        int length = deflater.deflate(buffer) ;
        result new byte[length] ;
        System.arraycopy(buffer, 0, result, 0, length) ;
        return result;
}
/****************************************************************
 * simpleUnZip
 * Unzipping compressed bytes using the ZLIB algorithm
 ****************************************************************/
public byte[] simpleUnZip(byte[] data) {
 byte[] result = null;
 try {
        Inflater Inflater - new Inflater(true) ;
        inflater.setInput(data, 0,data.length) ;
        byte[] buffer = new byte[5000] ;
        int length = inflater.inflate(buffer) ;
        result = new byte[length] ;
        System.arraycopy(buffer, 0, result, 0, length) ;
 } catch (Exception ex) {
        System.out.println("It happens") ;
 }
 return result;
}
/****************************************************************
 * specialSerialize
 * Serializing an object using TLV structure to replace redundant
   information
 ****************************************************************/
public TLV specialSerialize(Object object) {
   TLV result = null;
   System.out.println("\nspecial serialize . . . \n") ;
   // just a simplified implementation without nested classes!
   try {
   // 1.) create the attributeTLV Containing the attributes TLV
   attributeTLV null;
   Field[] fields=object.getClass( ) .getFields;
   For (int i=0; I<fields.length; 1++)
        {
// get field name
String fieldName = fields[i].getName( ) ;
System.out.println("optimized serialization of field
"+fieldName) ;
TLV nameTLV = new TLV ( TAG_NAME,fieldName.getBytes( )) ;
if (attributeTLV == null)
AttributeTLV - new TLV (TAG_ATTRIBUTE, nameTLV) ;
else
AttributeTLV.add(nameTLV) ;
    // get fieldValue and Type
    Object fieldValue = fields[i].get(object) ;
    Class fieldType = fields[i].getType( ) ;
    TLV typeTLV=null;
    TLV valueTLV = null;
        // Strings . . .
        if
(fieldType.isAssignableFrom(Class.forName("java.lang.String"
))) {
typeTLV = new TLV ( TAG_TYPE , TYPE_STRING) ;
valueTLV = new TLV ( TAG_VALUE ,
((String)fieldValue).getBytes( )) ;
    }
    else
    {
    // Integers . . .
  if   (fieldType.isAssignableFrom(Class.forName("jav.lang.
    Integer"))) {
        typeTLV = new TLV ( TAG_TYPE , TYPE_INTEGER) ;
valueTLV = new TLV ( TAG_VALUE ,    ((Integer)fieldValue
                                      ).intValue( )) ;
    } else{
        // other Objects . . .
        type TLV = new TLV ( TAG_TYPE , TYPE_OBJECT) ;
    // o.k. go into recursion . . .
TLV embeddedObjectTLV = specialSerialize(fieldValue) ;
valueTLV = new TLV ( TAG_VALUE,
embeddedObjectTLV.toBinary( )) ;
        }
    attributeTLV.add(typeTLV) ;
    attributeTLV.add(valueTLV) ;
}
    // 2.) create the Class TLV
    TLV classTLV = new TLV (TAG_CLASS,
    object.getClass( ).getName( ).getBytes( )) ;
    System.out.println("optimized serialization of class
    "+object.getClass( ).getName( )) ;
    // 3.) create the wrapper around the attributes
    TLV objectTLV = new TLV (TAG_OBJECT, classTLV) ;
    // ****TO DO****TO DO objectTLV.add(versionTLV) ;
    objectTLV.add(attributeTLV) ;
```

-continued

```
   result = new byte[length] ;
   System.arraycopy(buffer, 0, result, 0, length) ;
 } catch (Exception ex) {
   System.out.println("It happens") ;
 }
 return result;
}
```

-continued

```
// we've got it now: objectTLV is our specialZipped
Object!
Result = objectTLV;
} catch (Exception ex) {
    System.out.println("It happens") ;
    ex.printStackTrace( ) ;
}
    return result;
}
/*****************************************************************
*   specialRestore
Restoring an object serialized with the method
specialSerialize( )
*****************************************************************/
public Object specialRestore(TLV data) {
    Object result = null;
    System.out.println("\nspecial restore . . . \n") ;
        try
        {
            TLV objectTLV = data;
// unzip the object itself
    TLV classTLV = objectTLV.findTag(TAG_CLASS, null) ;
    Class objectClass = Class.forName(new StringclassTLV
                    ValueAsByteArra
                    y ( ))) ;
    System.out.println("restoring Class
    "+objectClass.getNane( )) ;
    result = objectClass.newInstance( ) ;
// restore the version . . .
// ****TO DO****
// restore all values of the object
    TLV attributeTLV = objectTLV.findTag(TAG_ATTRIBUTE,
null) ;
// loop through all attributes of the attribute TLV
    TLV lastProcessedNameTLV = null;
    TLV lastProcessedTypeTLV = null;
    TLV lastProcessedValueTLV = null;
    TLV aNameTLV = null;
    TLV aTypeTLV = null;
    TLV aValueTLV = null;
    do
    {
        // find the next subTLV in the attributeTLV
            aNameTLV =
                    attributeTLV.findTag(TAG_NAME, lastProces
                    sed
                    NameTLV) ;
    aTypeTLV = attributeTLV.findTag(TAG_TYPE,
    lastProcessedTypeTLV) ;
    aValueTLV = attributeTLV.findTag(TAG_VALUE,
    lastProqessedValueTLV) ;
    if ((aNaneTLV!=null) && (aTypeTLV!=null) &&
    (aValueTLV!=null))
    {
    // restore the field "aNane" with the value "aValue"
        String aName = new String (aNameTLV.valueAsByteArray( )) ;
            System.out.println("restoring Field "+ aName) ;
            Field field = objectClass.getField(aName) ;
            int aType = aTypeTLV.valueAsNumber( ) ;
            if (aType == TYPE_STRING) {
                // STRING . . .
        String aValue = new String
        (aValueTLV .valueAsByteArray( )) ;
        field.set(result, aValue) ;
        } else {
                    if (aType == TYPE_INTEGER) {
                    // INTEGER . . .
                    Integer aValue = new Integer
                    (aValueTLV.valueAsNumber( )) ;
                        field.set(result, aValue) ;
            } else {
                // OBJECT . . .
                // o.k. go into recursion . . .
                Object aValue = specialRestore (new TLV
(aValueTLV.valueAsByteArray( ))) ;
                    field.set(result, aValue) ;
                } // else integer
            } // else string
    } // if TLV's !=null
```

-continued

```
        lastProcessedNameTLV = aNameTLV;
        lastProcessedTypeTLV = aTypeTLV;
        lastProcessedValueTLV = aValueTLV;
    }while ((aNameTLV! = null)) ;
} catch (Exception ex) {
    System.out.println("It happens") ;
    Ex.printStackTrace( ) ;
}
return result:
}
```

The invention claimed is:

1. Method of producing a compact representation of a data package, the data package comprising at least one of meta-data and associated data elements and meta-data and associated data packages, where the meta-data comprises at least one of name and type identifications for the data element and name and type identifications for the data package, comprising the steps of:
   a) arranging of the data packages in a sequence;
   b) searching of the meta-data for defined, non-application-dependent name and type identifications; and
   c) representing the identifications found in step b) by replacing the identifications with defined substitutes which require little storage space.

2. Method according to claim 1 further comprising the step of:
   storing the result of steps a–c on a storage medium.

3. Method according to claim 1 further comprising the step of:
   transmitting the result of steps a–c to a data-processing device.

4. Method according to claim 3, wherein the data package is a Java object.

5. Method according to claim 1, characterized in that the data package is an object which contains at least the following data elements with the following non-application-dependent identifications:
   object name, object type and object attributes.

6. Method according to claim 1, wherein the data package is in XML (extendable markup language).

7. Method according to claim 1 wherein the non-application-dependent identifications object name, object type, object version and object attributes are represented by defined substitutes in a TLV coding.

8. Method according to claim 1 wherein the non-application-dependent identifications object name, object type, object version and object attributes are represented by defined substitutes in the TLV coding laid down by ISO 8825 Basic Encoding Rules.

9. Method according to claim 1 wherein the data package is a data structure which contains data elements with the following non-application-dependent identifications:
   name, type, version and attributes of the data element.

10. Method according to claim 1 wherein steps a–c are performed by a program, with a table to correlate non-application-dependent identifications with their associated substitutes being contained in the program.

11. Method according to claim 1 comprising the following further steps:
   aa) searching of the meta-data for defined, application-dependent identifications;
   bb) representation of the application-dependent identifications found in step aa) by defined substitutes which require little storage space;

cc) storage of the result of steps aa)–bb) on a storage medium or transmission of the result of steps aa)–bb) to a data-processing device.

12. Method according to claim 11, wherein for each application a dedicated table containing defined application-dependent identifications and associated substitutes is loaded.

13. Method according to claim 11, comprising the following further step:
   aaa) application of a current compression algorithm to the result of steps aa)–bb); and
   bbb) storage of the result of step aaa) on a storage medium or transmission of the result of step aaa) to an data-processing device.

14. Method according to claim 13 wherein the compression algorithm is the ZLIB compression algorithm.

15. Method according to claim 1 wherein the makeup, definition and length of the substitutes are laid down by standard ISO/IEC 7816 or 8825.

16. Method according to claim 15, characterized in that the substitute occupies a maximum of 2 bytes of storage space.

17. Chip card comprising at least one nonvolatile store for storing the compact representation of claim 1.

18. Method of producing a compact representation of a structure of meta-data and data elements, with the correlation of meta-data with data, comprising data elements or a sub-structure of a structure being performed by a program and with the meta-data comprising at least name and type identifications for the data, comprising the steps of:
   a) combining of meta-data and associated data to form a plurality of data packages;
   b) arranging the data packages in a sequence;
   c) searching the meta-data for defined, non-application-dependent identifications; and
   d) representing the identifications found in step c) by replacing the identifications with defined substitutes which require little storage space.

19. Method according to claim 18 further comprising the step of:
   storing the result of steps a–d on a storage medium.

20. Method according to claim 18 further comprising the step of:
   transmitting the result of steps a–d to a data-processing device.

21. Method according to claim 20, wherein the data package is a Java object.

22. Method according to claim 18 wherein the meta-data is not transmitted at the same time but the correlation is performed by a program at the time of restoration.

23. Method according to claim 18, characterized in that the data package is an object which contains the following data elements with the following non-application-dependent identifications:
   object name, object type, object version and object attributes.

24. Method according to claim 18 wherein the non-application-dependent identifications object name, object type, object version and object attributes are represented by defined substitutes in a TLV coding.

25. Method according to claim 18 wherein the non-application-dependent identifications object name, object type, object version and object attributes are represented by defined substitutes in the TLV coding laid down by ISO 8825 Basic Encoding Rules.

26. Method according to claim 18 wherein the data package is a data structure which contains data elements with the following non-application-dependent identifications:
   name, type, version and attributes of the data element.

27. Method according to claim 18 wherein steps a)–d) are performed by a program, with a table to correlate non-application-dependent identifications with their associated substitutes being contained in the program.

28. Method according to claim 18 comprising the following further steps:
   aa) searching of the meta-data for defined, application-dependent identifications;
   bb) representation of the application-dependent identifications found in step aa) by defined substitutes which require little storage space;
   cc) storage of the result of steps aa)-bb) on a storage medium or transmission of the result of steps aa)-bb) to a data-processing device.

29. Method according to claim 28, comprising the following further step:
   aaa) application of a current compression algorithm to the result of steps aa)–bb); and
   bbb) storage of the result of step aaa) on a storage medium or transmission of the result of step aaa) to an data-processing device.

30. Method according to claim 29 wherein the compression algorithm is the ZLIB compression algorithm.

31. Method according to claim 28, wherein for each application a dedicated table containing defined application-dependent identifications and associated substitutes is loaded.

32. Method according to claim 18 wherein the makeup, definition and length of the substitutes are laid down by standard ISO/IEC 7816 or 8825.

33. Method according to claim 32, characterized in that the substitute is make up of class, constructed flag and ID.

34. Chip card comprising at least one nonvolatile store for storing the compact representation of claim 18.

35. Apparatus comprising at least:
   a) a data-processing device;
   b) communications means;
   c) a chip card, with data being exchangeable between the data-processing device and the chip card via the communications means, characterized in that a program to control a method according to claim 1 can be installed on the data-processing device and the result of the method according to claim 1 is stored on the chip card.

36. Apparatus comprising at least:
   a) a data-processing device;
   b) communications means;
   c) a chip card, with data being exchangeable between the data-processing device and the chip card via the communications means, characterized in that a program to control a method according to claim 18 can be installed on the data-processing device and the result of the method according to claim 18 is stored on the chip card.

37. Computer software product which can be stored in the internal store of a digital computer, containing items of software code to carry out the method of producing a compact representation of a data package, the data package comprising at least one of meta-data and associated data elements and meta-data and associated data packages, where the meta-data comprises at least one of name and type identifications for the data element and name and type identifications for the data package, comprising the steps of:
 a) arranging of the data packages in a sequence;
 b) searching of the meta-data for defined, non-application-dependent name and type identifications; and
 c) representing the identifications found in step b) by replacing the identifications with defined substitutes which require little storage space.

38. Computer software product which can be stored in the internal store of a digital computer, containing items of software code to carry out the method of producing a compact representation of a structure of meta-data and data elements, with the correlation of meta-data with data, comprising data elements or a sub-structure of a structure being performed by a program and with the meta-data comprising at least name and type identifications for the data, comprising the steps of:
 a) combining of meta-data and associated data to form a plurality of data packages;
 b) arranging the data packages in a sequence;
 c) searching the meta-data for defined, non-application-dependent identifications; and
 d) representing the identifications found in step c) by replacing the identifications with defined substitutes which require little storage space.

\* \* \* \* \*